United States Patent [19]
Braun et al.

[11] 3,946,276
[45] Mar. 23, 1976

[54] ISLAND ASSEMBLY EMPLOYING COOLING MEANS FOR HIGH DENSITY INTEGRATED CIRCUIT PACKAGING

[75] Inventors: Robert E. Braun, Norristown; Richard H. Jones, Wayne; George J. Sprenkle, Phoenixville, all of Pa.; Herbert Stopper, Orchard Lake, Mich.

[73] Assignee: Burroughs Corporation, Detroit, Mich.

[22] Filed: Oct. 9, 1974

[21] Appl. No.: 513,283

[52] U.S. Cl................. 317/100; 357/79; 174/15 R
[51] Int. Cl.²......................................... H01L 23/24
[58] Field of Search......... 317/100, 101 D, 101 CC, 317/101 CD, 101 CB; 174/DIG. 3, DIG. 5; 339/75 MP, 112 L, 17 CF, 17 LM, 17 M; 357/75, 79, 82

[56] References Cited
UNITED STATES PATENTS

| 3,320,488 | 5/1967 | Karew et al. | 317/101 CB |
| 3,611,562 | 10/1971 | Herb | 317/101 CC |
| 3,662,225 | 5/1972 | Carter | 317/101 D |
| 3,731,254 | 5/1973 | Key | 174/DIG. 3 |
| 3,755,719 | 8/1973 | Wilcox | 357/79 |
| 3,794,886 | 2/1974 | Goldman | 317/100 |

OTHER PUBLICATIONS
Microcircuit Module and Connector, Franck and Hill, IBM Tech. Discl. Bull., Vol. 13, No. 7, Dec. 1970, pp. 1786.
Dual In–Line Package for Integrated Circuits, Horn, Western Electric, Technical Digest No. 27, July 1972, p. 19.

Primary Examiner—Gerald P. Tolin
Attorney, Agent, or Firm—Francis A. Varallo; Edward J. Feeney, Jr.; Kevin R. Peterson

[57] ABSTRACT

A system is described which provides for high density packaging of electronic equipment, particularly data processing systems. Subnanosecond integrated circuits of the LSI or MSI type in pluggable packages are adapted to be installed in receptacles or connectors. A cooling frame is provided which supports the package connectors as well as the package-to-package interconnection medium. In accordance with the system, groups of integrated circuit packages logically partitioned into functional elements and having, for example, gate complexities of the order of four thousand to ten thousand gates, comprise an island. The system may be expanded further by interconnecting several islands.

11 Claims, 12 Drawing Figures

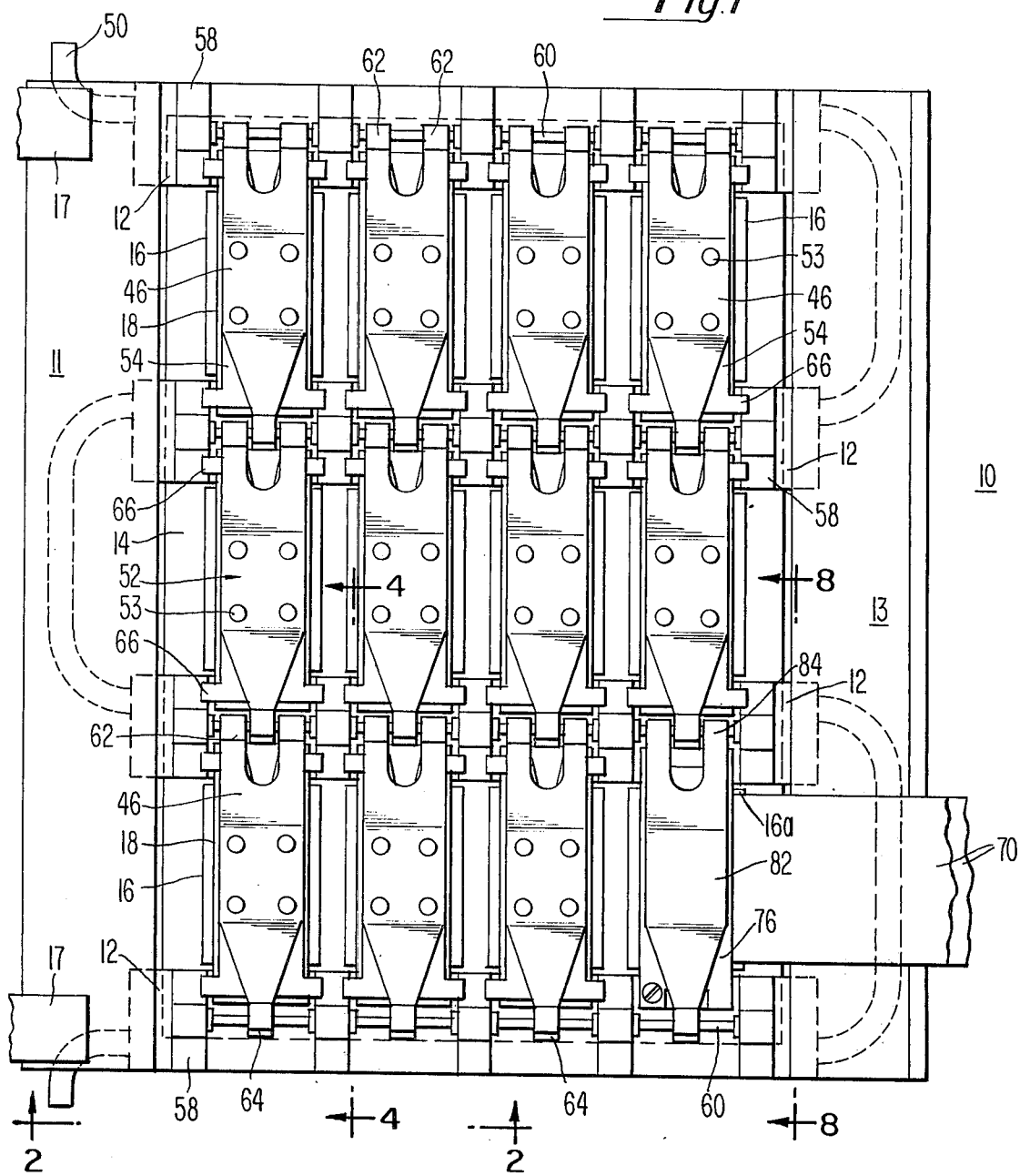
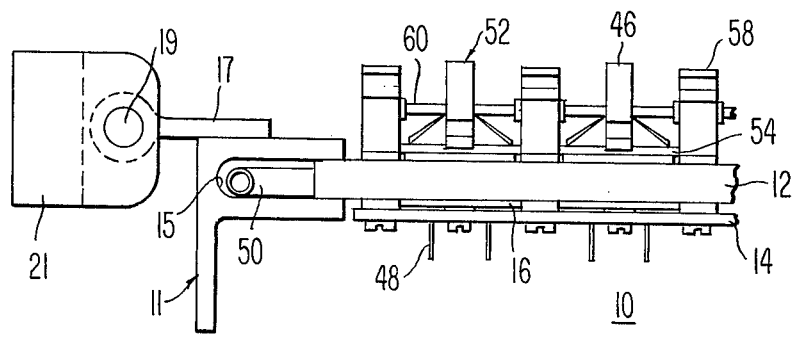

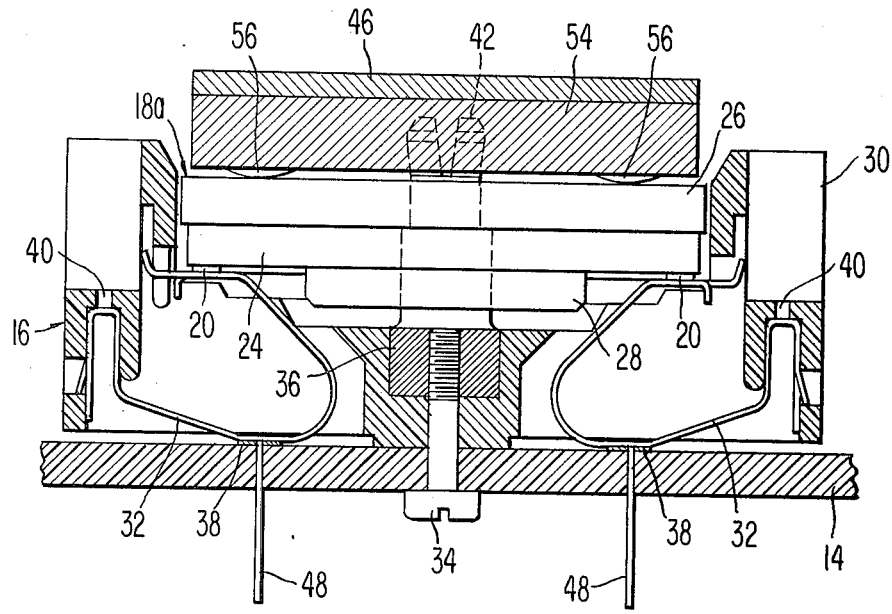
_Fig.5_
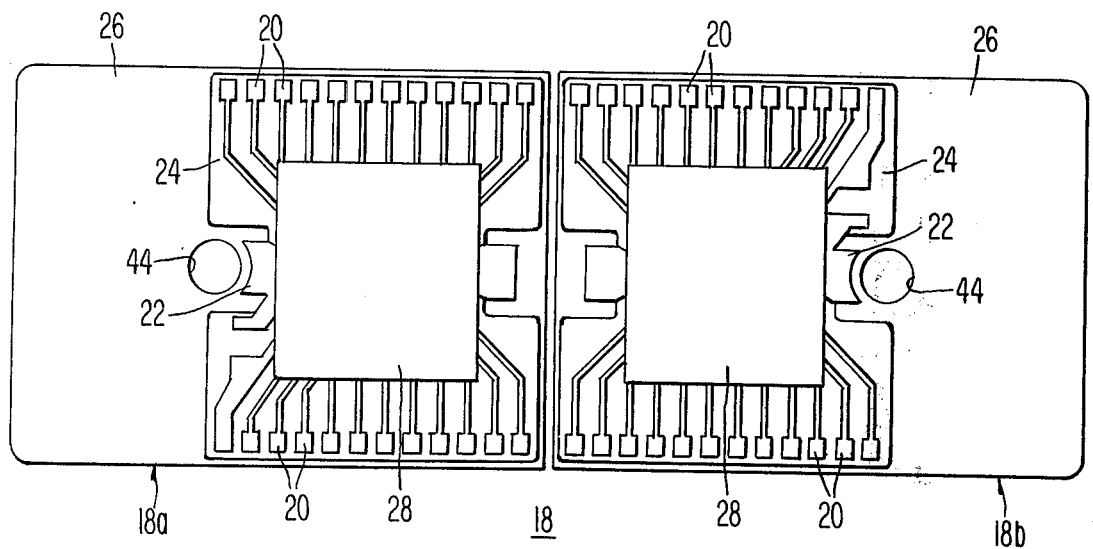
_Fig.6_

ISLAND ASSEMBLY EMPLOYING COOLING MEANS FOR HIGH DENSITY INTEGRATED CIRCUIT PACKAGING

CROSS REFERENCE TO RELATED APPLICATION

To the extent that the present invention involves integrated circuits, which may be packaged in the manner described and claimed in application Ser. No. 465,678 for "Leadless Ceramic Package for Integrated Circuit Having Heat Sink Means" by Robert S. Morse, such application is referenced herein. This copending application is assigned to the same assignee as the present application.

BACKGROUND OF THE INVENTION

Present high speed computer systems and particularly those of the next generation, require both subnanosecond high density integrated circuits and the packaging technology to fully exploit their capabilities.

Such packaging technology includes the acceptance of a family of integrated circuit packages, functionally arranged in comparatively large basic elements of partitioning. This insures that only minimum and regular interconnections are required at this level. Efficient cooling means are required to provide higher power densities in order to maximize the MSI and LSI. Interconnection schemes for the packages must be provided to secure impedance control, with elimination or reduction of cross talk problems created by fast rise times. Also, such control is necessary to account for signal propagation delays resulting from delays in the semiconductors themselves.

Underlying all of the foregoing is the need for a heretofore unavailable standard packaging technique for computer systems which is oriented toward high quantity production and assembly processes to achieve minimum costs. It is to these goals that the present invention is directed.

SUMMARY OF THE INVENTION

In accordance with the invention there is provided at least one island comprised of a plurality of pluggable integrated circuit packages, connectors or receptacles for receiving the packages, the inter-package connection plate or medium and a cooling frame.

The integrated circuit packages are of the so called leadless variety which provide conductor metallization on an insulated carrier and have no protruding leads. Electrical connection is made by a receptacle or connector which presses a set of upper contacts against the metallization. Electrical continuity is maintained from these contacts through the body of the connector to a lower set of homologous contacts, which press against the pads of the island interconnection medium. The pads may be electrically interconnected by a variety of well known means, for example, they may be connected to pins which emanate from the opposite side of the medium, and which are wired together in the required configuration with conventional wire-wrap methods. The interconnection board or medium is versatile. For example, no holes are required to receive the connectors and therefore, no restrictions on the choice of the interconnection means is imposed thereby. The island cooling frame supports the package interconnection medium and the connectors. The frame incorporates continuous tubing arranged in a serpentine path, through which a liquid coolant is pumped to carry away the heat generated by the integrated circuit packages. This heat transfer is accomplished efficiently by permitting the carrier or metal heat sink plate which forms the top surface of the package opposite to that which carries the lead pattern metallization to make thermal contact with the cooling frame. The circulating coolant is maintained at a substantially uniform temperature. As compared with forced air convection systems, a considerable reduction in the system thermal resistance is achieved, and hot spots and package thermal interaction are minimized. Also, since all four sides of the logic island are available for interconnection, there is no concern over blocking air flow with cables.

Finally, a plurality of islands may be interconnected as desired. Since the high speed circuits are situated on an island, only those connections which are less critical as to speed need be effected from island to island. The interconnection of islands to each other or to other electrical modules either within the system or external thereto, is easily accomplished in the present system through the use of ribbon-type interconnect cables, having termination boards on each end. These boards are adapted to plug into the same connectors as the integrated circuit packages. Thus, any connector position on an island may be suitably wired to permit input and/or output information to be carried to or from the position via the interconnect cables.

Other features of the invention will become more fully apparent in the detailed description of the packaging system which follows.

BRIEF DESCRIPTION OF THE DRAWING

FIG. 1 is a plan view of an island illustrating the packaging system.

FIG. 2 is a section view taken along lines 2—2 of FIG. 1 and depicting a means for mounting and supporting the island.

FIG. 5 is a section view taken along lines 5—5 of FIG. 4 and depicting the relationship of components associated with a single integrated circuit package.

FIG. 6 is a plan view of an integrated circuit package of the "split-package" variety, which comprises a pair of integrated circuits adapted to plug into a single connector.

DESCRIPTION OF THE PREFERRED EMBODIMENT

Figure 7:
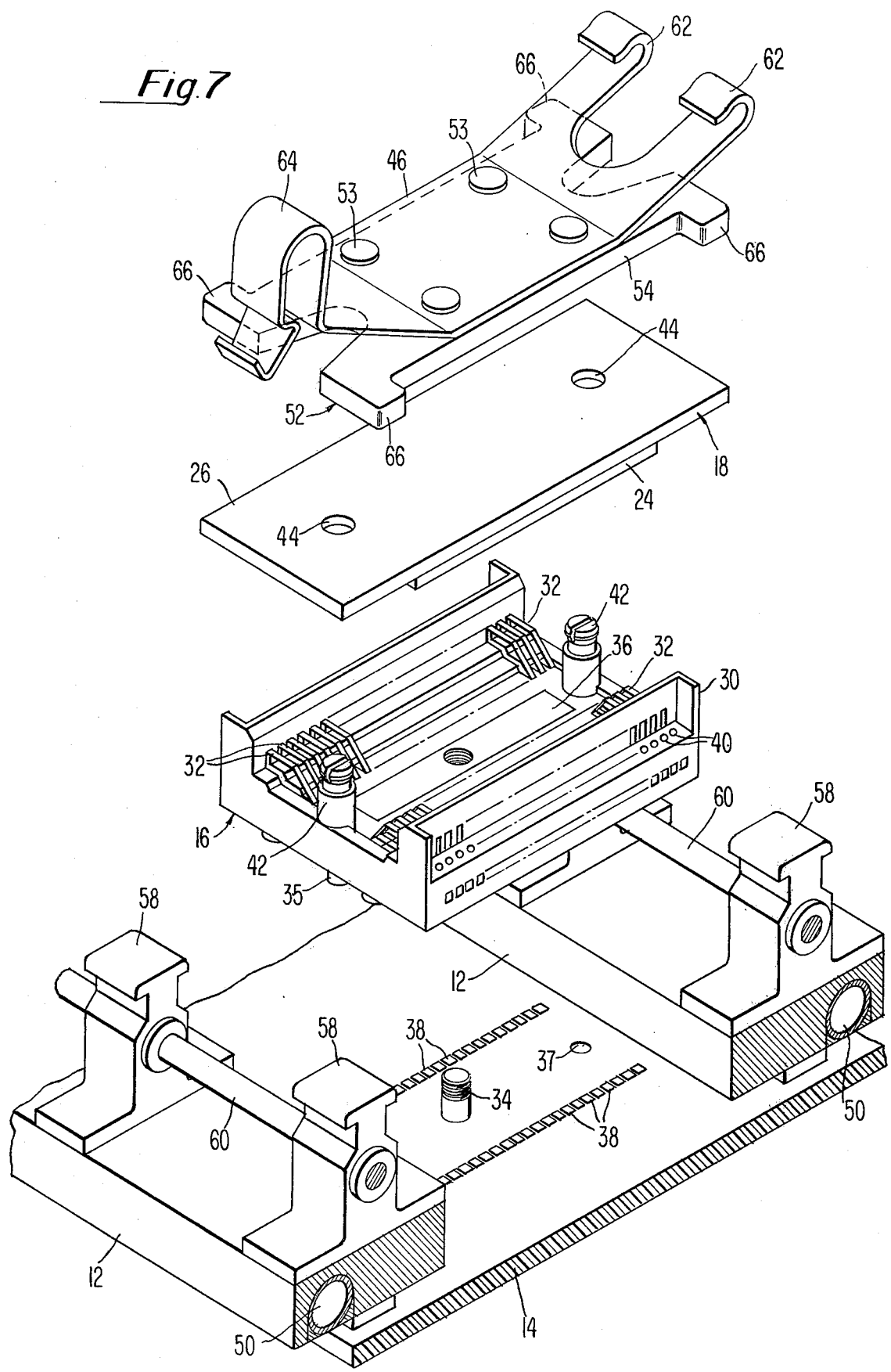
FIG. 7 is an exploded pictorial view of a unitary portion of the packaging system.

A view of the overall packaging system of the present invention appears in FIG. 1, although specific reference to the other figures where indicated will enhance an understanding thereof. The exploded pictorial view of FIG. 7 is particularly enlightening and general reference thereto throughout the description which follows, will be helpful to the reader. Like reference characters have been used throughout to designate similar components. For purposes of explanation, FIG. 1 depicts a small island 10 comprised of a cooling frame 12 and the interconnection plate or medium 14, for supporting twelve connectors 16 (FIG. 4) adapted to accommodate the integrated circuit packages 18 (FIGS. 5 and 6) which are preferably the leadless ceramic type described in the reference copending application. In practice, the island may hold as many as one hundred and eight connectors in a frame which is approximately 14 inches by 23 inches. Depending upon the application, even larger islands may be employed.

FIG. 2 presents a partial edge view of the island 10 of FIG. 1, taken along lines 2—2 of the latter Figure. A support member seen as an L section 11 is fastened to one side of the interconnection medium 14 and a T section 13 (FIG. 10), on the other side. In both cases, the sections are configured with a slotted region 15 to accommodate the "bend" portions of the tubing 50. A hinge member 17 adapted to pivot about rod 19 of support 21, is attached to the L section 11, thereby permitting rotation of the island 10 and accessibility to both sides thereof.

Considering each of the major components in turn and their relationship to one another, the integrated circuit package 18 will receive initial consideration. As seen in clear detail in FIGS. 5 and 6, the total integrated circuit package 18 may comprise a pair of "leadless" pluggable package components 18a and 18b of either SSI or MSI variety, each component having twenty-four leads 20 plus a ground connection 22. This is the so called "split-package" configuration. It should be understood that a single 50 lead LSI package 18 as indicated in FIG. 7 could also be employed without modification of the package connector 16. In either case, in an actual operative embodiment, the leads are arranged so that half the total number appear on opposite sides of the package, with a typical lead center-to-center spacing of 0.050 inches. As noted hereinbefore, the integrated circuit packages may be of the type described in the referenced copending application. In accordance with the latter and continued reference to FIGS. 5 and 6, the leadless package 18 may utilize a ceramic body 24 having the silicon chip (not shown) hermetically sealed in a cavity formed therein. The internal leads of the package for providing access to the chip are adhered to a layer of glass fused to the ceramic body 24. A carrier or metallic heat sink member 26 is fused to the entire lower surface of the ceramic body. The ceramaic between the integrated circuit chip and the heat sink 26 is made sufficiently thin to give good heat conduction while maintaining electrical insulation. The heat sink member 26 has integral extensions at its opposite extremes which are adapted to be clamped against the cooling frame 12 as will be described in more detail hereinafter. In order to provide a ground connection for the integrated circuit, the package ground leads 22 are connected to the package heat sink 26 which provides an electrical path to the cooling frame 12 in addition to the thermal path. A lid or cover 28 which may be of ceramic or a suitable metal alloy protects the integrated circuit chip.

Figure 3:
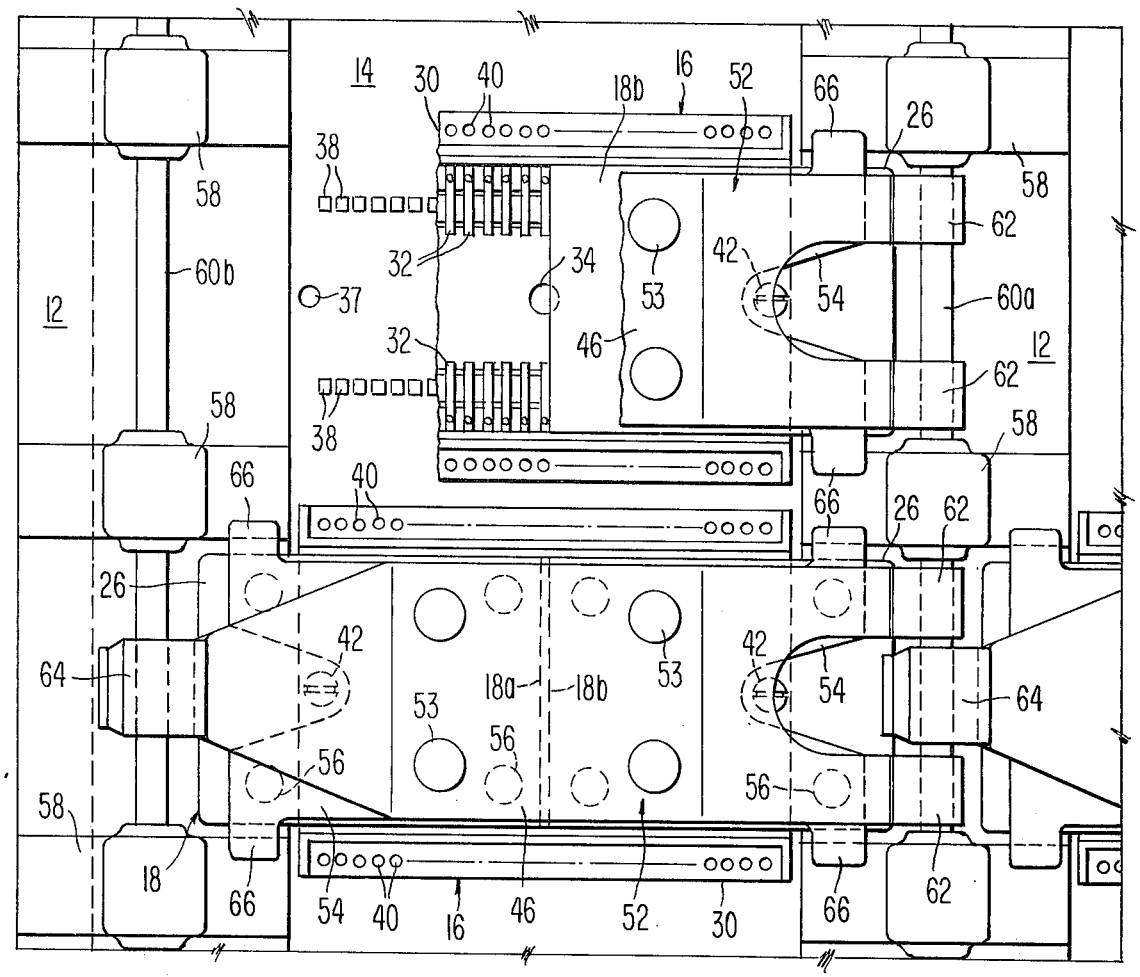
FIG. 3 is an enlarged plan view of part of the island with portions cut-away to better illustrate the relationship of the integrated circuit package, the connector, and the interconnection medium.
Figure 4:
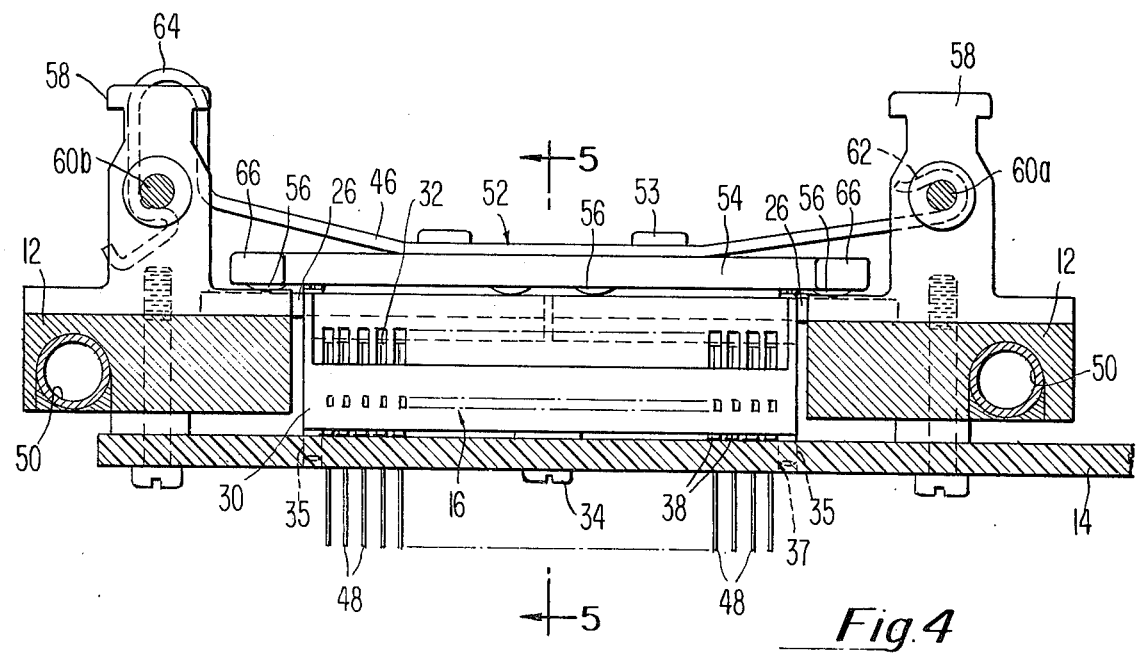
FIG. 4 is a section view taken along lines 4—4 of FIG. 1 and illustrating the system components for a single integrated circuit package.

In order to make electrical contact with the terminal portions of the integrated circuit package leads 20, a receptacle or connector 16 as seen in FIGS. 3, 4 and 5, is provided. The connector comprises a molded body 30 of insulative material and a plurality of contacts 32, one for each of the package terminals. Each connector is fastened to the interconnection medium 14 (which may be of the printed circuit board variety) by any suitable means, such as screw 34, threaded into a metallic member 36, as seen in FIG. 5. A pair of locating pins 35 (FIG. 7) situated on the underside of the connector body 30 mate with the holes 37 in the interconnection medium 14. These pins serve to position the lower contact elements 32 over the conductive pads 38. The integrated circuit package 18 which may be of the single large chip variety (FIG. 7), or a pair of split-packages (FIG. 6) are placed in the connector 16. Each contact 32 which is in the form of a continuous loop presses against a terminal lead 20 of the integrated circuit package 18 on its upper portion, and against a conductive pad 38 on the interconnection medium 14, on its lower portion. Additionally, as seen in FIGS. 3 and 5, each contact loop 32 is formed to present a flat portion thereof to circular openings 40 in the connector body located along the longitudinal sides thereof. These openings permit the electrical probing of the contacts while the integrated circuit packages are in place and the system is operative. As seen in FIG. 5, another feature of the connector 16 is the use of a pair of package alignment and retention pins 42. In order to insert the integrated circuit package 18, the split top on each of these pins is gently pressed together in order that the pin may be inserted through the holes 44 provided in the integrated circuit package carrier 26. This arrangement serves to prevent the inadvertent dislodging of the package from the connector particularly when the force exerted by the hold down spring 46 (FIG. 4) to be described in greater detail hereinafter, is suddenly released. As seen in FIG. 5 the connector contacts 32 press against the conductive pads 38 of the interconnection medium 14. These pads in turn may be connected to pins 48 which protrude through the medium and which may then be interconnected by various wiring means, such as wire wrap techniques. Alternately, while not shown, the aforementioned mode of wiring may be eliminated if the interconnection medium 14 incorporates printed wiring throughout. It is apparent that no holes are required in the interconnection medium 14 to accommodate the connectors 16 themselves. Moreover, no solder art assembly is required. This arrangement provides much freedom in the design of the interconnect medium and a single connector design is compatible with a wide variety of interconnect means.

As seen particularly in FIGS. 1 and 4, a cooling frame 12 is provided to facilitate the transfer of heat from the integrated circuit devices 18. The frame 12 is fastened to the interconnection medium 14, which in turn supports the package connectors 16. A cooling liquid is pumped through a continuous tubing 50 in a serpentine path to carry away the heat. Even at moderate coolant flow rates, a nearly uniform fluid temperature is maintained. The nominal temperature of the cooling fluid must be low enough to limit the maximum device junction temperature, and high enough to prevent condensation on the cooling frame 12. As seen particularly in FIG. 4, when the integrated circuit package is placed in the connector 16, the extensions of its heat sink member 26 will tend to come to rest on the cooling frame 12.

With reference to FIGS. 3 and 4, in order to insure both electrical continuity between the connector contacts 32 and the integrated circuit package leads 20, and the proper thermal interface between the extensions of the package heat sink member 26 and the cooling frame 12, a hold down device 52 is provided. The device comprises a spring-like member 46 to which is secured by rivet-like attachments 53 a pressure plate 54, the latter having a number of formed protuberances 56 which bear against the package heat sink member 26. The hold down device 52 is positioned between adjacent members of the cooling frame 12 by virtue of groups of elevated brackets 58 fastened to the frame 12 and each group supporting a common rod 60 which passes therethough. One end of the hold down spring-like member 46 is notched in a U-shaped configuration such that the extremities of the legs 62 of the U are wrapped around the rod 60a to prevent the hold down device 52 from coming free. The opposite end of member 46 which is a single projection 64 is configured to latch in opposition to the force of spring member 46 with the opposite rod 60b. It should be noted that the latch projection 64 is designed to contact the latter rod 60b and occupy the space formed by the U notch between the pair of legs 62 of the spring member in the same column and next succeeding row of hold down devices.

In terms of an actual operative embodiment, the connector contacts 32 which are economically of base metals require a high pressure with a force of approximately 14 pounds per split package (18a or 18b of FIG. 6) or 28 pounds per location for the package of FIG. 7 to insure electrical continuity. Moreover, in order to maintain a thermal interface of 100 psi between the integrated circuit package 18 and the cooling frame 12, an additional 18 pound load is required per split package. Considering tolerance take up, the hold down device 52 provides 35 pounds per split package or 70 pounds per location.

The hold down device 52 operates properly if only one of the split packages of FIG. 6 is inserted into the connector 16. This is accomplished by the "ears" 66 on the pressure plate 46 which restrains downward motion of the latter even if no package is in place in the connector. The hold down device 52 itself is contained at all times by virtue of the legs 62 wrapped around rod 60 (FIG. 1) and this is important since high insertion and release forces are involved. However, the device is able to swing clear by rotation of the spring 46 about rod 60, thereby facilitating the removal and insertion of packages. Only a simple tool, such as a screwdriver, is needed to latch and release the hold down mechanism.

Figure 8:
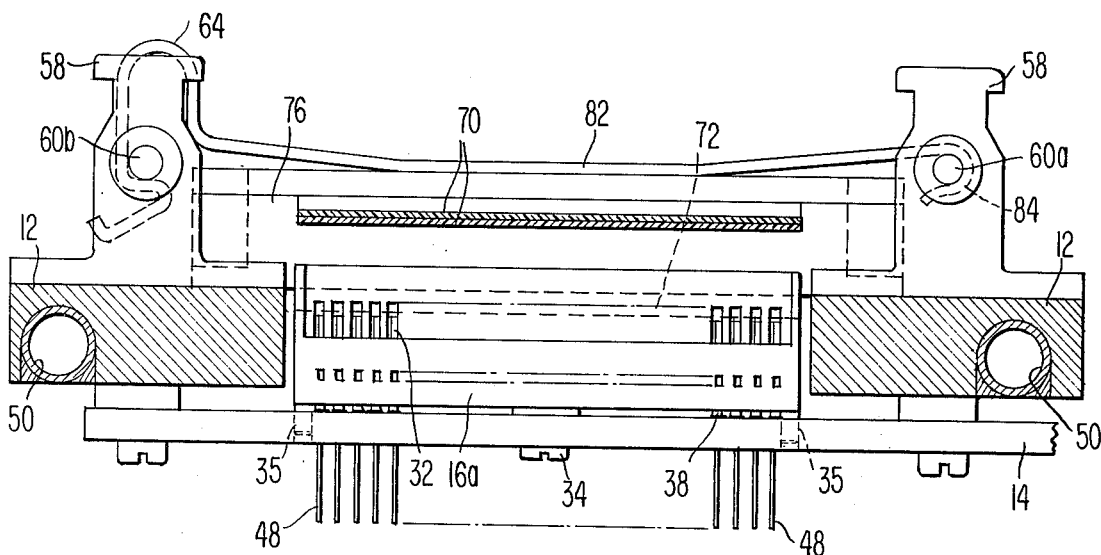
FIG. 8 is a section view taken along lines 8—8 of FIG. 1 to illustrate the placement of the interconnect cables and termination board in a standard connector.
Figure 9:
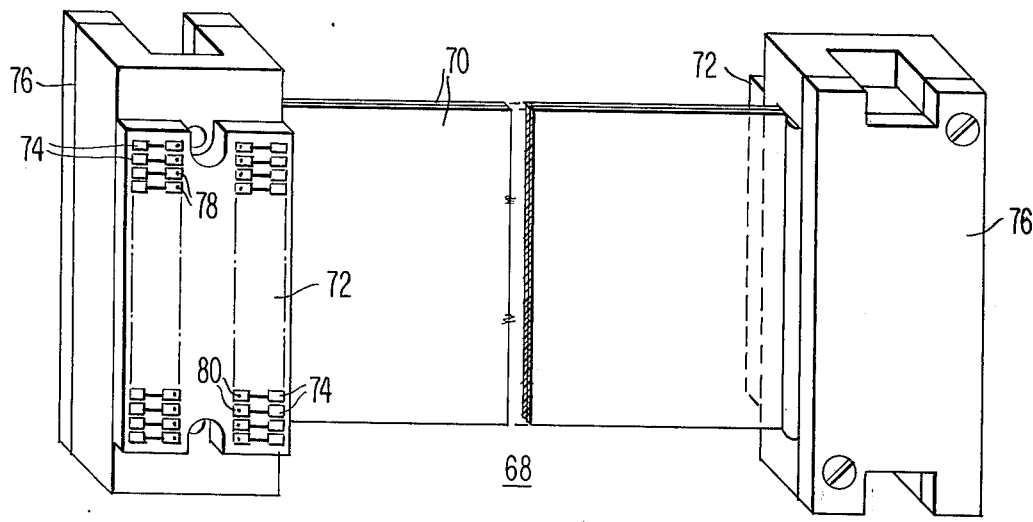
FIG. 9 is a pictorial view of the ribbon-type interconnect cables and the termination assemblies at each end thereof, for electrically interconnecting islands.

In the consideration of the invention thus far, the island 10 of FIG. 1 has been described as having integrated circuit packages 18 mounted in the connectors 16. However, connector 16a (FIG. 8) has been arbitrarily chosen for purpose of example, to accept an interconnect cable assembly 68 (FIG. 9) instead of such a package. This arrangement permits input and/or output signal information to be transferred from the island 10 to other islands or to electrical devices which may be included in, or are external to, the system. The cable assembly comprises a pair of ribbon-type cables 70 each having a plurality of conductors, a termination board 72 with a plurality of conductive pads 74 and the board housing 76. The termination board pads 74 correspond in number and position to the contacts 32 of the connector 16. The number of conductors in each of the cables 70 is chosen to be the same as the number of contacts on one side of the connector. For convenience, the conductors at one end of a cable may be terminated at points 78 along one side of the board, while the conductors at the corresponding end of the other cable may be terminated at point 80 along the opposite side of the board 72. The termination board housing 76, seen in FIGS. 1, 8 and 9, is considerably thicker than the integrated circuit package 18 seen in FIGS. 4 and 5. For this reason, the hold down device 52 illustrated in the last mentioned Figures is modified as seen in FIG. 8. No pressure plate 54 is required, and the spring member 82 has a more shallow contour. To accommodate the increased thickness of the termination board housing 76, the legs 84 of the device are wrapped about rod 60 in a direction opposite to that of the integrated circuit package hold down device 52. It should be understood that in accordance with the particular application and the package wiring scheme effected on pins 48 (FIG. 4), the interconnect cable assemblies 68 may be plugged into any connector position on an island. Moreover, more than one assembly may be utilized between the various islands.

Figure 10:
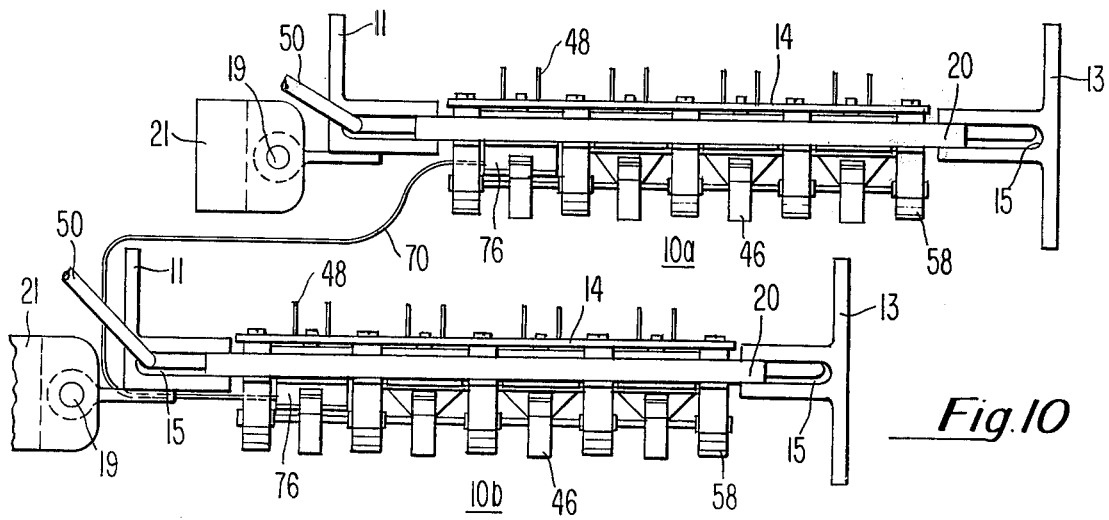
FIG. 10 illustrates the use of the interconnect cables shown in FIG. 9 for electrically connecting a pair of islands, shown in edge configuration.

FIG. 10 illustrates a practical method of interconnecting islands, utilizing the cable assembly 68 of FIG. 9. A pair of islands 10a and 10b are shown edge-wise in vertical planes and in offset spaced-apart relation, each being pivotally mounted by virtue of hinge member 17 and L section 11. Cables 70 situated on the hinged side of the islands permit electrical interconnection without interfering with the accessibility to both sides of the islands.

Figure 11:
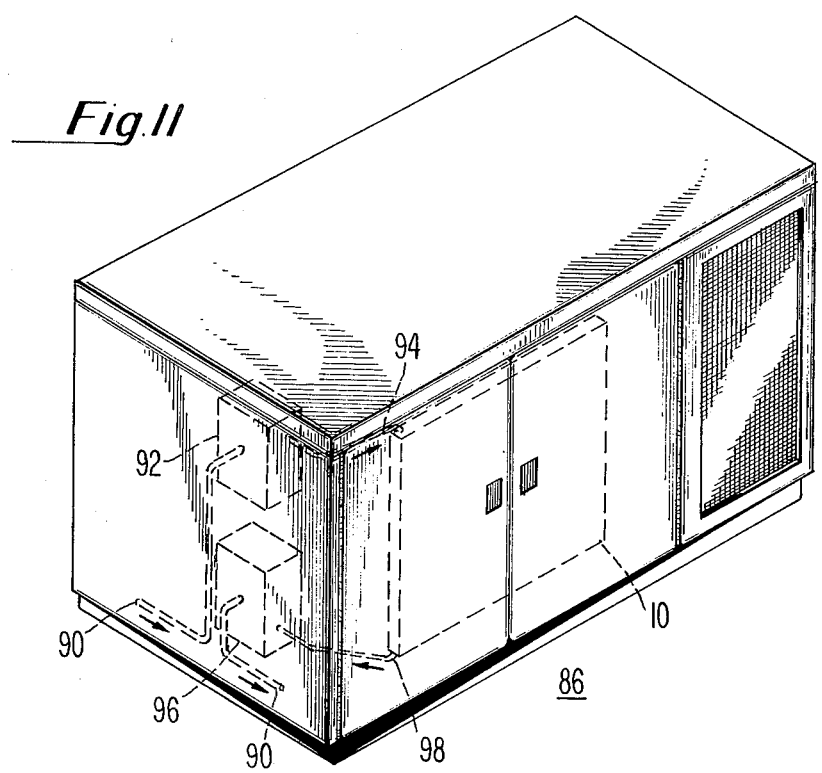
FIG. 11 is a pictorial view of a console suitable for housing the island components of the present system.
Figure 12:
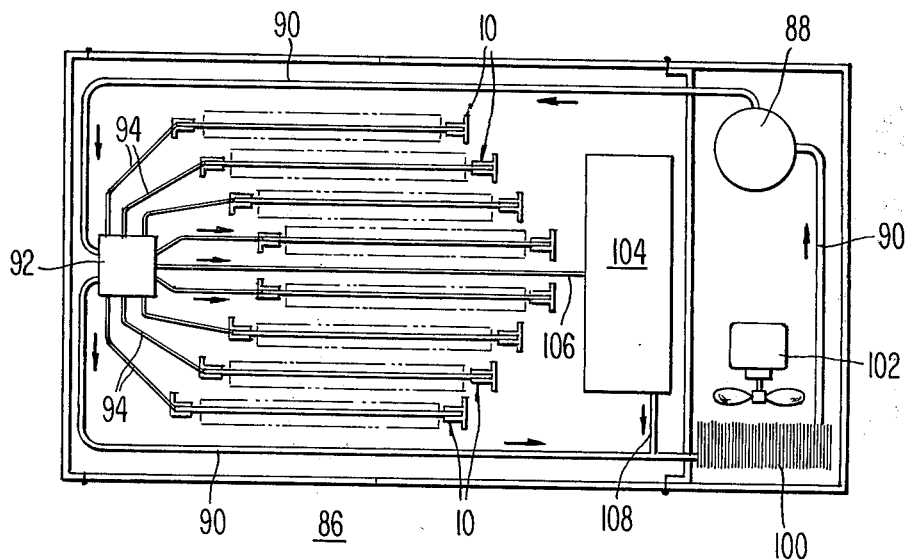
FIG. 12 is a plan view of the console (with its top removed) illustrating a plurality of islands and a mode of providing a circulating coolant through the cooling

FIG. 11 illustrates a cabinet or console 86 for housing a plurality of islands, which for example, may implement a data processing system or portions thereof. FIG. 12 shows such a typical arrangement of islands 10, and cooling and power supply apparatus, as seen by an observer looking down into the console 86 which has had its top section removed.

The coolant is circulated by pump 88 through the main tubing 90 in the direction indicated by the arrows. An intake manifold 92 supplies all of the island upper tubing inlets through secondary tubes 94. An output manifold 96 (seen in FIG. 11) coupled to all of the island lower tubing outlets through tubes 98 provides the return path via tubing 90 to the heat exchanger 100 and then back to the pump 88. Air flow over the exchanger is provided by fan 102. The heat generating components of the power supply 104 are also cooled by coolant delivered by tube 106 and returned through tube 108. It is significant to note that in the cooling method described hereinbefore, the interconnection medium 14 is kept absolutely free from obstruction, penetration or other interference by the cooling components.

The rudimentary cooling system just described is intended solely for purpose of example. It is apparent that the method of removing heat from the cooling fluid will vary depending upon the total amount of heat to be rejected by liquid cooling. In the example above, it is assumed that the liquid cooling represents only a small portion of the total heat load, and heat rejection is directly to the system room air. No external module fluid connections are required. However, in a system where a large portion of the heat is to be removed by liquid cooling, the heat would be rejected directly into the building chilled water system. This application requires a central circulating pump, controls and fluid connections to each module. Alternately, an indirect transfer into the central water system may be accomplished through the use of an intermediate heat exchanger. This last approach is more amenable to installation of the island consoles in an already existing environment.

In conclusion, it is apparent that a higher density packaging system has been disclosed which is well suited for high speed computers. The inventive concepts and implementation described herein are directed to a particular application, chosen for purpose of explanation. In other applications, changes and modifications in the system may be necessary. Such changes and modifications, insofar as they are not departures from the true scope of the invention, are intended to be covered by the claims appended hereto.

What is claimed is:
1. A packaging system for electronic equipment comprising at least one island, said island including
   a plurality of integrated circuit packages, each package having a plurality of electrical conductors and a heat sink member with integral extensions at its opposite extremes,
   connector means mounting said packages,
   an interconnection medium having a plurality of conductive pads,
   each of said connector means having a plurality of electrical contacts and being operatively connected in predetermined relationship to said interconnection medium and providing respective electrical paths between said integrated circuit package electrical conductors and said interconnection medium conductive pads, and
   a cooling frame fastened to said interconnection medium on the same side thereof as said conductive pads, said cooling frame being configured such that a plurality of sections of thermally conductive material are situated in parallel spaced-apart relationship across the surface of said interconnection medium, each of said connector means being located in the space between an adjacent pair of said cooling frame sections, the heat sink member of each integrated circuit package mounted in said connector means straddling said means such that said integral extensions contact respectively said last mentioned pair of cooling frame sections.

2. A packaging system as defined in claim 1 wherein said integrated circuit packages are of the leadless variety in which said electrical conductors take the form of conductive pads.

3. A packaging system as defined in claim 2 wherein the conductive pads associated with ground potential in each integrated circuit package are connected to said heat sink member, the contact of said integral extensions of the latter with said cooling frame providing a system electrical ground path through said frame.

4. A packaging system as defined in claim 2 further including wiring means attached to said interconnection medium and interconnecting said interconnection medium conductive pads in predetermined relationship in accordance with the functions of said integrated circuit packages.

5. A packaging system as defined in claim 4 wherein said wiring means includes pins connected respectively to said interconnection medium conductive pads and emanating from the surface of said medium opposite to that bearing said pads.

6. A packaging system as defined in claim 4 wherein said cooling frame incorporates within itself continuous tubing arranged in a serpentine path connecting said parallel sections and adapted to transport a fluid coolant.

7. A packaging system as defined in claim 6 further including a pump coupled to said tubing for circulating said coolant therethrough, and heat exchanger means operatively coupled to said tubing.

8. A packaging system as defined in claim 6 further including means for applying respective holddown forces to said integrated circuit packages in their mounted condition within said connector means, said hold-down forces insuring electrical continuity between the contacts of said connector means and the conductive pads of said integrated circuit packages, and thermal continuity between the extensions of said integrated circuit package heat sink members and said cooling frame.

9. A packaging system as defined in claim 8 further characterized in that the system includes a plurality of islands and means for establishing input/output signal connections with any given island and interconnections between islands.

10. A packaging system as defined in claim 9 further including means for pivotally mounting said plurality of islands in vertical planes and in offset spaced-apart relationship whereby both the front and back surfaces thereof are readily accessible.

11. A packing system as defined in claim 1 further characterized in that said connector means are arranged in rows and columns over the surface of said interconnection medium, said cooling frame parallel sections separating adjacent ones of said rows of connector means.

* * * * *